(12) United States Patent
Saito et al.

(10) Patent No.: US 11,226,488 B2
(45) Date of Patent: Jan. 18, 2022

(54) HEAD-UP DISPLAY

(71) Applicant: NIPPON SEIKI CO., LTD., Niigata (JP)

(72) Inventors: Wataru Saito, Niigata (JP); Bunkichi Kaneko, Niigata (JP); Masao Satoh, Niigata (JP); Tatsuya Hasegawa, Niigata (JP); Toshiro Tsurumaru, Niigata (JP); Yoshiyuki Iida, Niigata (JP)

(73) Assignee: NIPPON SEIKI CO., LTD., Niigata (JP)

( * ) Notice: Subject to any disclaimer, the term of this patent is extended or adjusted under 35 U.S.C. 154(b) by 0 days.

(21) Appl. No.: 16/969,845

(22) PCT Filed: Mar. 19, 2019

(86) PCT No.: PCT/JP2019/011413
§ 371 (c)(1),
(2) Date: Aug. 13, 2020

(87) PCT Pub. No.: WO2019/181927
PCT Pub. Date: Sep. 26, 2019

(65) Prior Publication Data
US 2020/0379256 A1 Dec. 3, 2020

(51) Int. Cl.
*G02B 27/01* (2006.01)
*B60K 35/00* (2006.01)
*H05K 7/20* (2006.01)

(52) U.S. Cl.
CPC .......... *G02B 27/0149* (2013.01); *B60K 35/00* (2013.01); *H05K 7/20409* (2013.01); *H05K 7/20963* (2013.01); *B60K 2370/1529* (2019.05)

(58) Field of Classification Search
None
See application file for complete search history.

(56) References Cited

U.S. PATENT DOCUMENTS

2007/0269714 A1* 11/2007 Watanabe ......... H01M 10/6555
429/120
2013/0155520 A1  6/2013 Shimada et al.
(Continued)

FOREIGN PATENT DOCUMENTS

JP   2010-006196 A   1/2010
JP   2010-152025 A   7/2010
(Continued)

OTHER PUBLICATIONS

International Search Report issued in corresponding International Patent Application No. PCT/JP2019/011413, dated May 14, 2019, with English translation.

*Primary Examiner* — Michelle M Iacoletti
*Assistant Examiner* — Danell L Owens
(74) *Attorney, Agent, or Firm* — McDermott Will & Emery LLP

(57) ABSTRACT

Provided is a head-up display having excellent handling properties. This head-up display is provided with a display panel, a substrate including a light source which illuminates the display panel from a rear surface thereof, a heat sink which dissipates heat transferred from the substrate, and a case which accommodates the heat sink. The case includes an opening exposing at least a portion of the heat sink, and a protecting wall which has a larger amount of protrusion than the amount of protrusion of the heat sink protruding from the opening, and which protects the heat sink protruding from the opening.

4 Claims, 6 Drawing Sheets

(56) References Cited

U.S. PATENT DOCUMENTS

| | | | |
|---|---|---|---|
| 2015/0373871 A1* | 12/2015 | Lv | H05K 5/0247 455/561 |
| 2018/0259807 A1 | 9/2018 | Yuuki et al. | |
| 2019/0047418 A1 | 2/2019 | Yoshimura et al. | |
| 2019/0129172 A1* | 5/2019 | Misawa | H05K 7/2039 |

FOREIGN PATENT DOCUMENTS

| | | |
|---|---|---|
| JP | 2013-125194 A | 6/2013 |
| JP | 2017-161661 A | 9/2017 |
| WO | 2017/090523 A1 | 6/2017 |

* cited by examiner

HEAD-UP DISPLAY

CROSS REFERENCE

This application is the U.S. National Phase under 35 U.S.C. § 371 of International Application No. PCT/JP2019/011413, filed on Mar. 19, 2019, which claims the benefit of Japanese Application No. 2018-053600, filed on Mar. 21, 2018, the entire contents of each are hereby incorporated by reference.

TECHNICAL FIELD

The present invention relates to a head-up display to be mounted on a vehicle or the like.

BACKGROUND ART

The head-up display includes a display device for displaying a display image. The display device includes, for example, a display panel and a backlight unit for illuminating the display panel. The backlight unit includes a substrate on which a light source is mounted, and a heat sink that dissipates heat generated by the light source to the outside of a case. The heat sink is formed of a metal having high thermal conductivity such as aluminum.

PRIOR ART DOCUMENT

Patent Document

Patent Document 1: Japanese Unexamined Patent Application Publication No. 2010-6196

SUMMARY OF THE INVENTION

Problems to be Solved by the Invention

To improve the manufacturability and reduce the weight of a head-up display, it is conceivable to form a heat sink from a heat conductive resin material. However, heat conductive resins are more brittle than metal.

Therefore, the heat sink may be damaged by an impact applied to the head-up display.

The present invention has been made in view of these circumstances, and an object thereof is to provide a head-up display having excellent handling properties.

Solution to Problem

To solve the above problems, a head-up display according to the present invention includes a display panel, a substrate including a light source that illuminates the display panel from a back side, a heat sink that dissipates heat transmitted from the substrate, and a case that accommodates the heat sink, and the case includes an opening that exposes at least a part of the heat sink, and a protective wall that has an amount of protrusion larger than an amount of protrusion of the heat sink protruding from the opening and protects the heat sink protruding from the opening.

Effect of the Invention

The head-up display according to the present invention has excellent handling properties.

MODE FOR CARRYING OUT THE INVENTION

An embodiment of a head-up display according to the present invention will be described with reference to the accompanying drawings. The head-up display according to the present invention is mounted on a vehicle such as an automobile.

Figure 1:
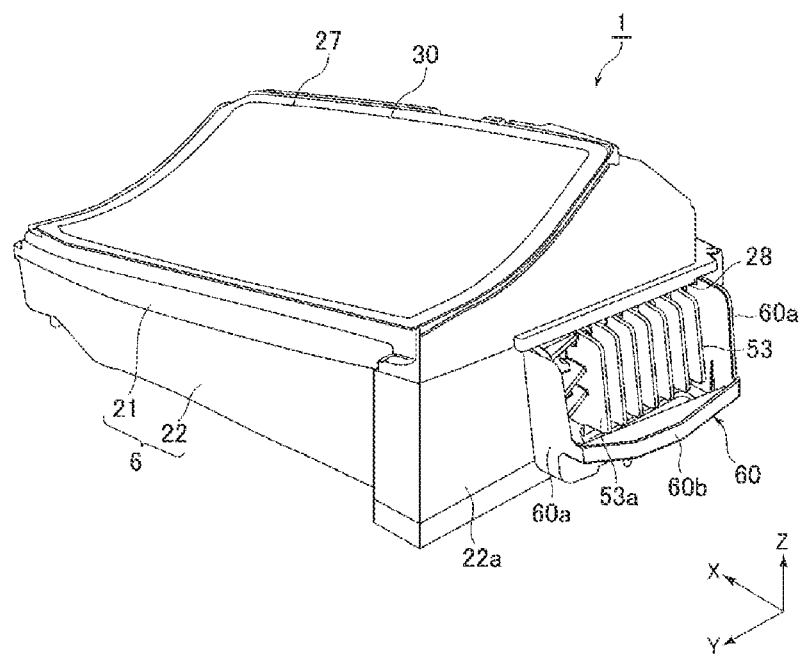
FIG. 1 is a perspective view for describing an overall configuration of an embodiment of a head-up display according to the present invention.

FIG. 1 is a perspective view for describing an overall configuration of an embodiment of a head-up display according to the present invention.

Figure 2:
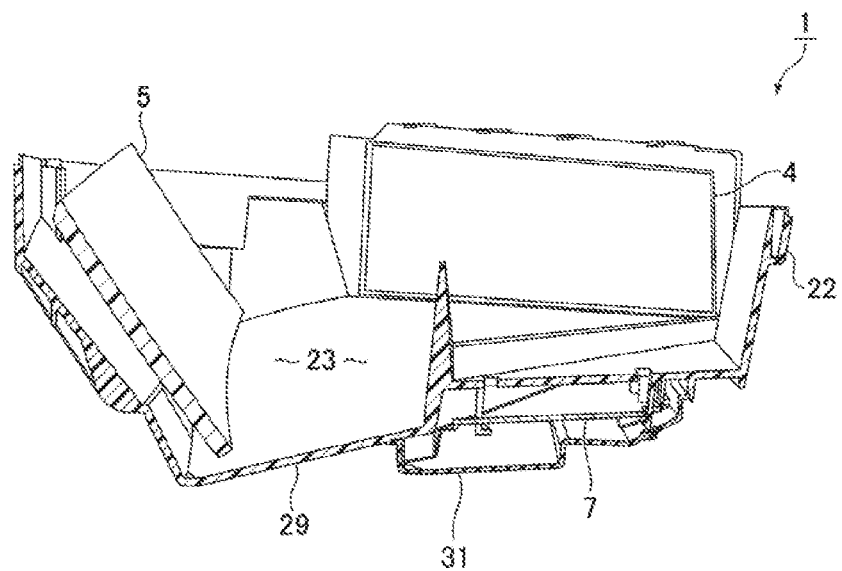
FIG. 2 is a vertical cross-sectional view of the head-up display in a state where an upper case and a light transmissive cover are removed.

FIG. 2 is a vertical cross-sectional view of a head-up display 1 in a state where an upper case 21 and a light transmissive cover 30 are removed.

Figure 3:
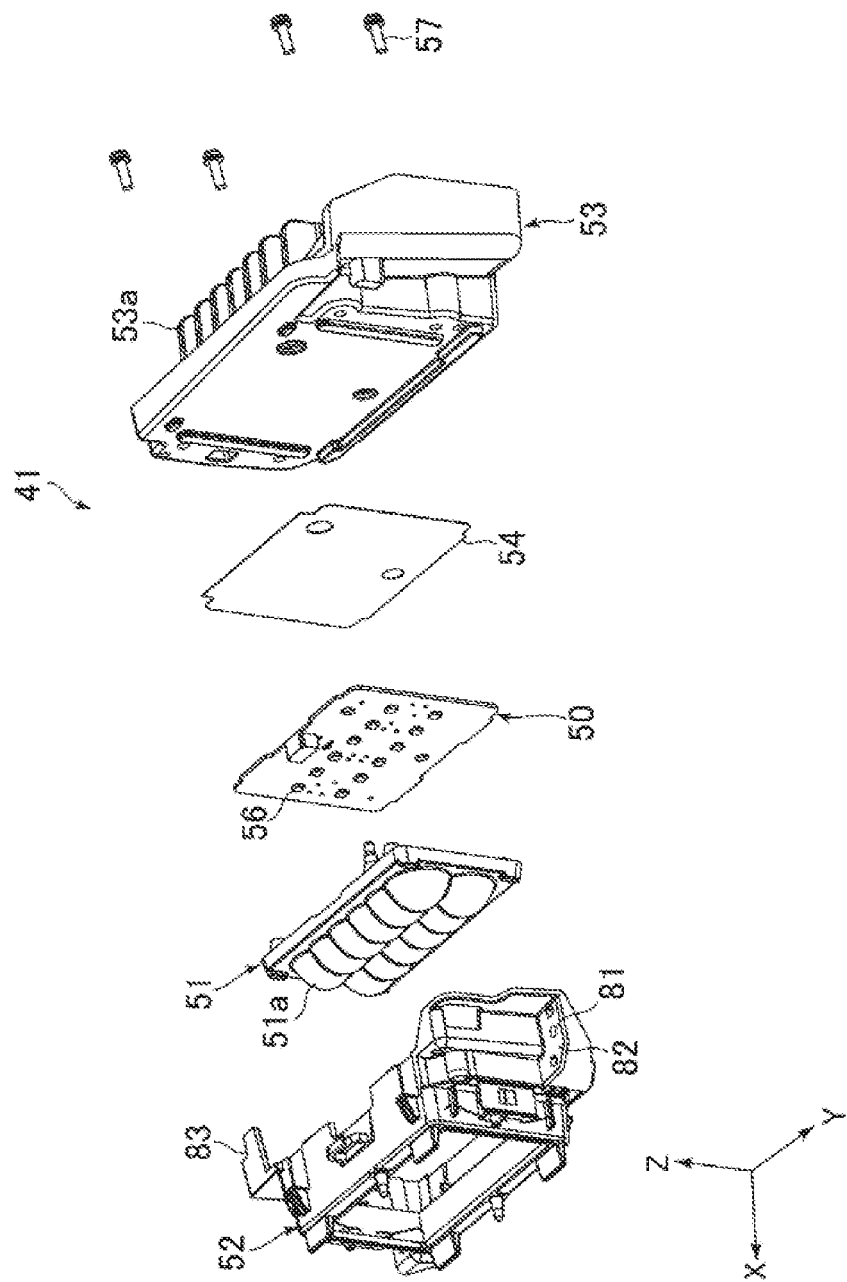
FIG. 3 is an exploded perspective view of a backlight unit.

FIG. 3 is an exploded perspective view of a backlight unit 41.

Figure 4:
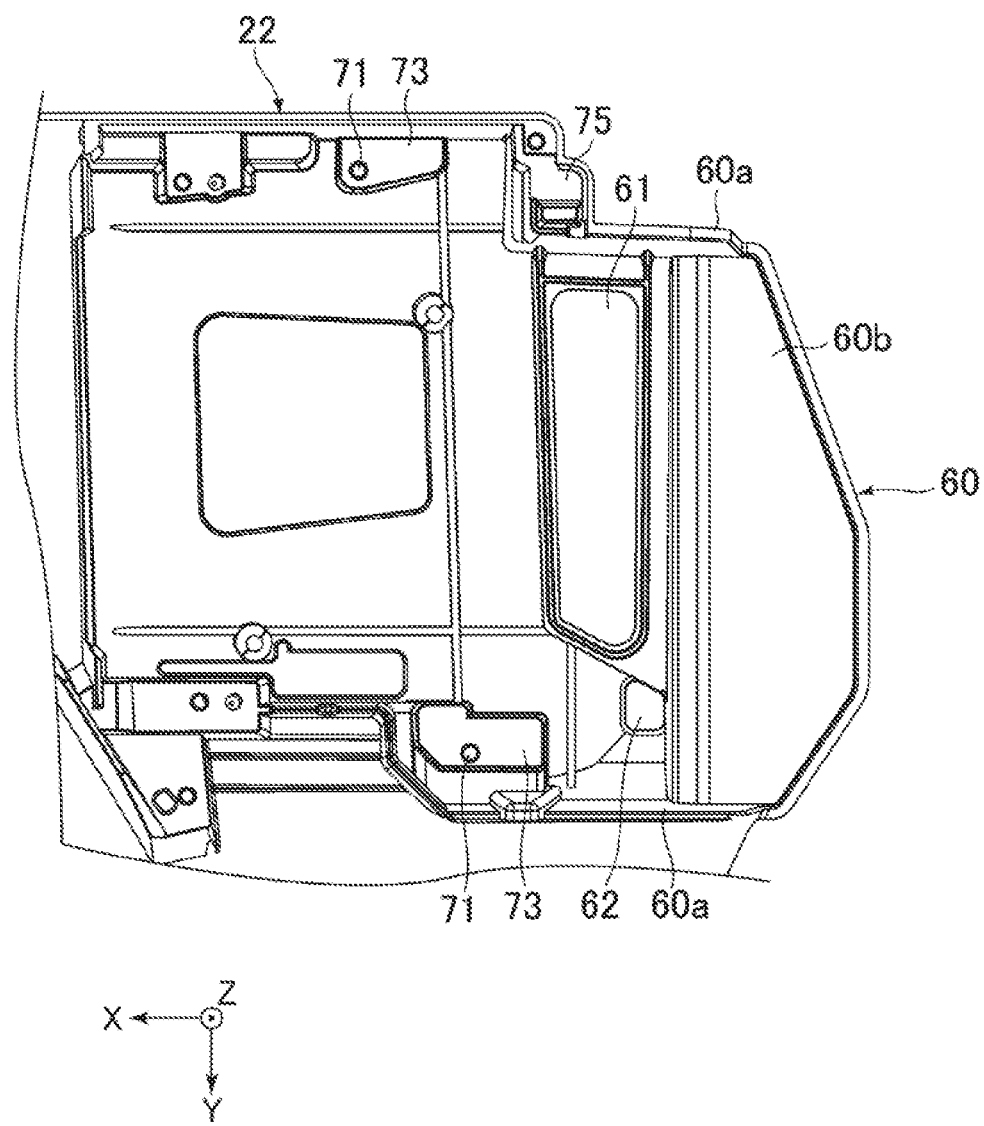
FIG. 4 is a plan view particularly illustrating a protective wall of a lower case and a periphery of a fixing structure of the backlight unit.

FIG. 4 is a plan view particularly illustrating a protective wall 60 of a lower case 22 and a periphery of a fixing structure of the backlight unit 41.

The head-up display 1 (hereinafter, referred to as HUD 1) is arranged in an instrument panel of an automobile. The HUD 1 mainly includes a display device 3 (FIG. 6), a plane mirror 4, a concave mirror 5, a case 6, and a control board 7. The HUD 1 reflects display light representing a display image displayed by the display device 3, on the plane mirror 4 and the concave mirror 5 forming a relay optical system, and emits the display light toward a windshield of an automobile, which is an example of a transmission-reflection unit. A viewer (mainly a driver) can visually recognize a virtual image of the display image that overlaps with an actual scene in front of the vehicle.

The display device 3 outputs display light. The display device 3 is, for example, a Thin Film Transistor (TFT) type liquid crystal display device. The display device 3 includes a liquid crystal display panel 40 and the backlight unit 41.

The liquid crystal display panel 40 (display panel) includes a liquid crystal cell and a polarizing plate. The liquid crystal cell includes a pair of light transmissive substrates on which a transparent electrode film is formed, and a liquid crystal layer enclosed by the light transmissive substrates. The polarizing plates are attached to both front and rear surfaces of the liquid crystal cell. Parallel light rays from a lens 51 of the backlight unit 41 pass through the liquid crystal display panel 40 and are output as display light.

As illustrated in FIG. 3, the backlight unit 41 includes a light source substrate 50, the lens 51, a lens holder 52, a heat sink 53, and a heat conductive sheet 54. In the backlight unit 41, the lens holder 52 accommodates the heat conductive sheet 54, the light source substrate 50, and the lens 51 that are layered on the heat sink 53. The heat sink 53 is fixed by screws 57 to the lens holder 52 that accommodates the lens 51, the light source substrate 50, and the like.

The light source substrate 50 includes a light source 56 that illuminates the liquid crystal display panel 40 from a back side. The light source 56 includes a light emitting element such as a Light Emitting Diode (LED) and emits light rays. The light source substrate 50 is, for example, an alumina (ceramic) substrate having excellent thermal conductivity.

The lens 51 collects the light rays emitted from the light source 56 and forms a light beam parallel to an optical axis of the HUD 1. In the lens 51, each of lens units 51a corresponds to one of the light sources 56. That is, if a plurality of the light sources 56 are used, the lens 51 includes a plurality of the lens units 51a.

The lens holder 52 is a cylindrical case formed of an impermeable resin material. The lens holder 52 guides the parallel light rays emitted from the lens 51 to the liquid crystal display panel 40. The lens holder 52 has a structure for fixing the entire backlight unit 41 to the case 6 (described in detail later). Moreover, the backlight unit 41 further includes a lens cover 58 and a lens 59 illustrated in FIG. 6 (not illustrated in FIG. 3). The lens 59 is a lenticular lens and is fixed to the lens holder 52 by the lens cover 58.

The heat conductive sheet 54 is provided between the light source substrate 50 and the heat sink 53, and efficiently transfers heat of the light source 56 to the heat sink 53.

The heat sink 53 dissipates in a fin 53a the heat generated by the light source 56, which is transmitted from the light source substrate 50. The heat sink 53 is made of a heat conductive resin. A part (fin 53a) of the heat sink 53 is exposed from an opening 28 of the case 6.

As illustrated in FIG. 2, the plane mirror 4 (reflecting mirror) includes a base made of, for example, a synthetic resin material, and a reflecting film formed on a surface of the base by vapor deposition or the like. The plane mirror 4 reflects the display light output from the display device 3 toward the concave mirror 5.

The concave mirror 5 includes a base made of, for example, a synthetic resin material, and a reflecting film formed on a surface of the base by vapor deposition or the like. The concave mirror 5 reflects the display light reflected by the plane mirror 4 toward the windshield. The concave mirror 5 functions as a magnifying mirror, and magnifies a display image and reflects the display image on the windshield. Thereby, the viewer visually recognizes a virtual image in which the display image is enlarged. The concave mirror 5 is rotated around a rotation axis by an actuator. The actuator rotates the concave mirror 5 to adjust an angle of the concave mirror 5 to adjust an irradiation position of the display light, or to adjust the angle of the concave mirror 5 to an angle at which external light is not reflected by the concave mirror 5 toward the display device 3.

The case 6 includes the upper case 21 and the lower case 22, which are made of, for example, a black synthetic resin having a light shielding property. In the case 6, the upper case 21 and the lower case 22 are combined, and thus, the case 6 includes an internal space 23 (FIG. 2) that accommodates the display device 3 (heat sink 53), the plane mirror 4, and the concave mirror 5. Further, in the case 6, the upper case 21 (second case) and the lower case 22 (first case) are fitted together to form the opening 28 that exposes at least a part of the heat sink 53, that is, the fin 53a.

As illustrated in FIG. 1, the upper case 21 includes an opening 27 provided in a portion facing the windshield. The opening 27 is covered by the light transmissive cover 30 that is light transmissive.

The lower case 22 has a structure for mainly attaching the display device 3, the plane mirror 4, the concave mirror 5, and the control board 7. In particular, the lower case 22 has a structure for fixing the backlight unit 41 (described in detail later). The lower case 22 includes the protective wall 60 that protects the heat sink 53 (fin 53a) protruding from the opening 28.

The protective wall 60 has a larger amount of protrusion than an amount of protrusion of the heat sink 53 protruding from the opening 28 with respect to a case side surface 22a. The protective wall 60 includes side surface side protective walls 60a and a bottom surface side protective wall 60b.

The side surface side protective walls 60a protect left and right side surfaces (surfaces facing a Y direction) of the heat sink 53.

The bottom surface side protective wall 60b protects a bottom surface (a surface facing a −Z direction) of the heat sink 53. As illustrated in FIG. 4, the bottom surface side protective wall 60b includes a heat exhaust port 61 and a drain hole 62. The heat exhaust port 61 causes convection of the heat dissipated by the heat sink 53. That is, the heat exhaust port 61 takes in air and promotes convection of the heat from the bottom to the top. Thus, the heat dissipation of the heat sink 53 is not hindered by the protective wall 60 surrounding the heat sink 53 on three sides. The drain hole 62 is provided at a lowermost position of the bottom surface side protective wall 60b in a vertical direction (−Z direction). The drain hole 62 drains water that may enter the inside of the lower case 22 (further inside than the protective wall 60) from the protective wall 60.

The control board 7 is a printed circuit board on which a control unit that controls an operation of the display device 3 and the like is mounted. The control unit includes, for example, a microcomputer including a storage device and an arithmetic device. Based on various types of vehicle information acquired from an in-vehicle network and various types of sensors, the control unit causes the arithmetic device to appropriately perform an arithmetic operation in accordance with an operation program stored in advance by the storage device to cause the display device 3 to display a display image. As illustrated in FIG. 2, the control board 7 is on an outer surface 29 of the lower case 22 and outside the internal space 23. The control board 7 is covered by a board cover 31 and fixed to the lower case 22 together with the board cover 31.

Next, the structure provided in the lens holder 52 and the lower case 22 for fixing the backlight unit 41 to the case 6 will be described in detail.

Figure 5:
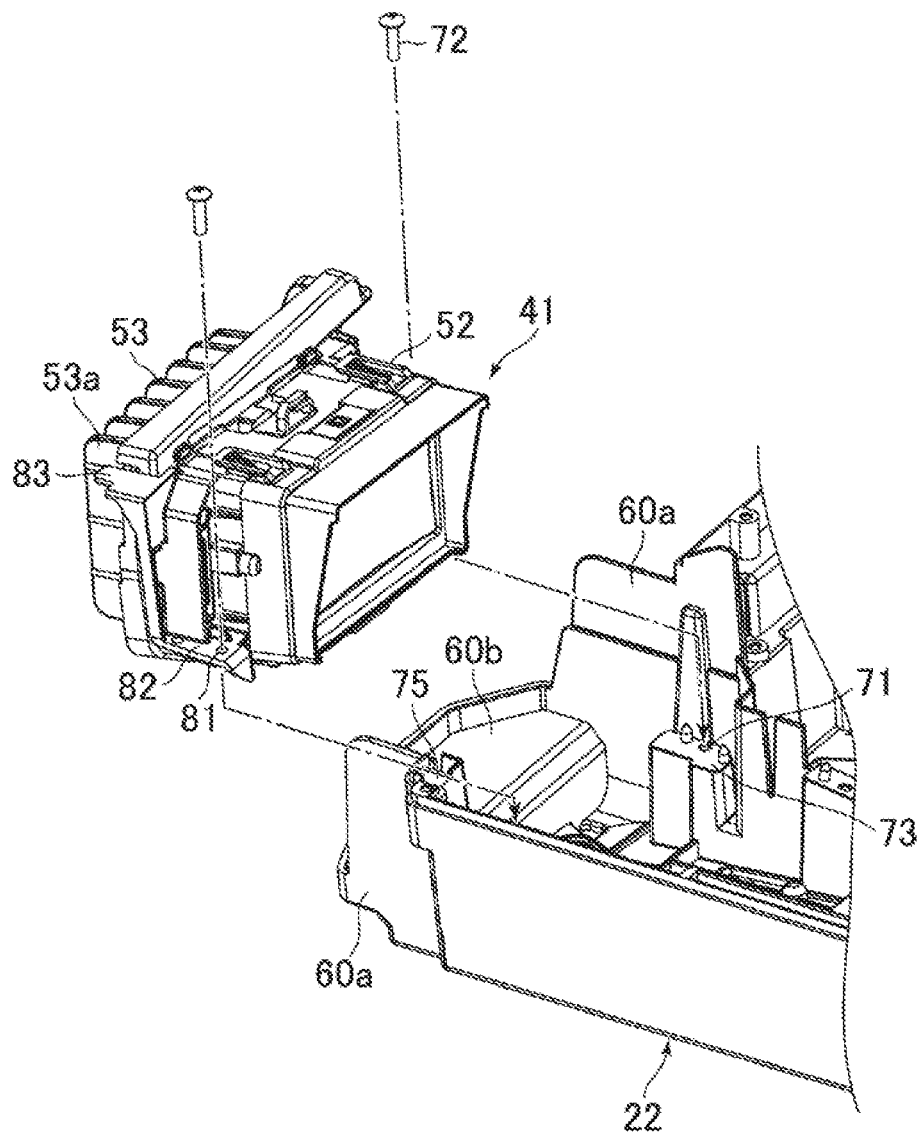
FIG. 5 is a perspective view particularly describing a relationship between the lower case and the backlight unit.

FIG. 5 is a perspective view particularly describing a relationship between the lower case 22 and the backlight unit 41.

Figure 6:
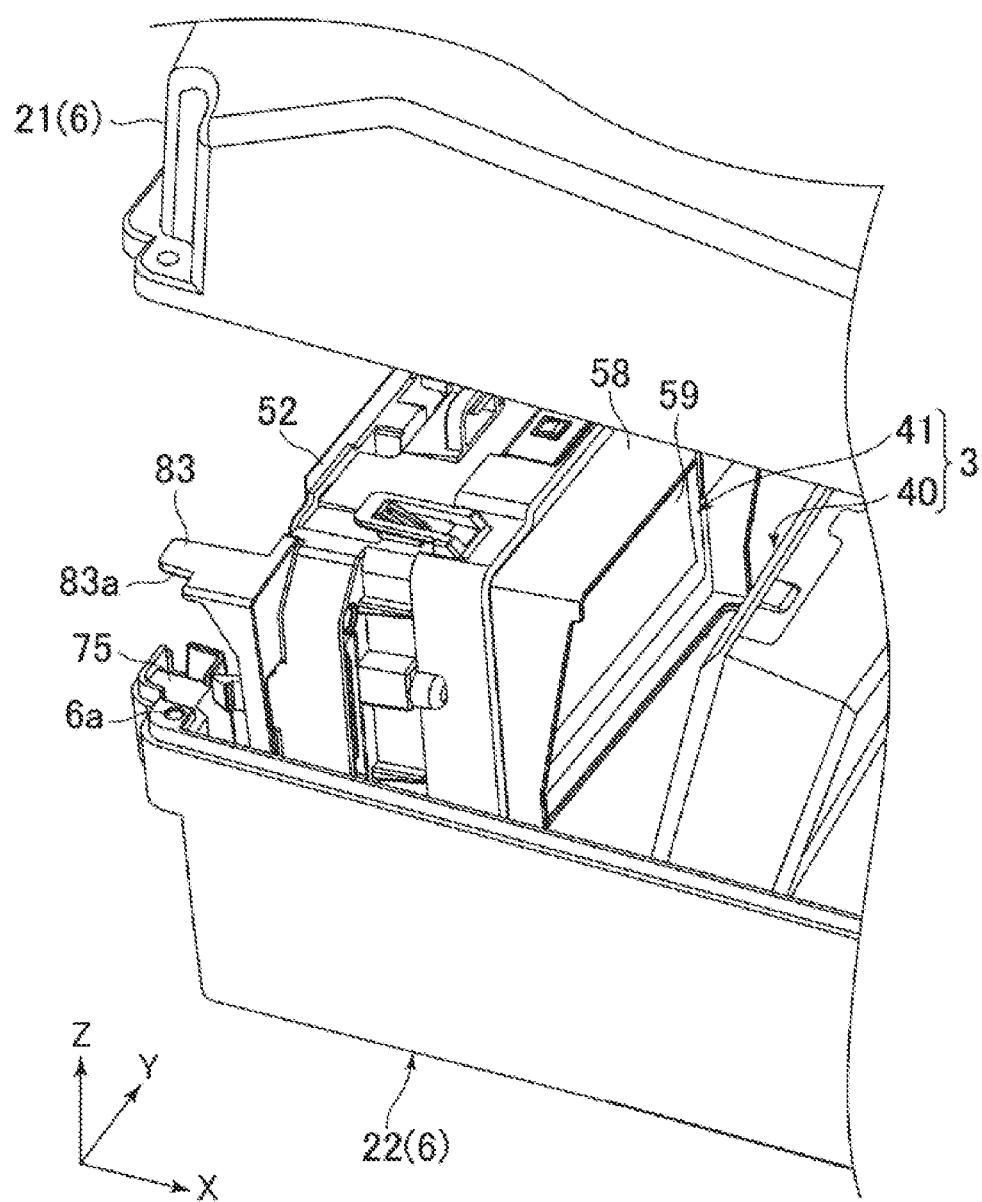
FIG. 6 is a perspective view particularly describing a relationship between a protruding piece and a case.

FIG. 6 is a perspective view particularly describing a relationship between a protruding piece 83 and the case 6. It is noted that the protective wall 60 is not illustrated in FIG. 6.

The lower case 22 includes two case side screw holes 71 and a protruding piece receiving unit 75.

The case side screw holes 71 (FIG. 4) receive screws 72 in an up-down direction (Z direction). The screw holes 71 are provided in case side pedestals 73 including a seat surface that substantially coincides with a horizontal plane (XY plane). The screw holes 71 are provided at two locations corresponding to positions of holder side screw holes 81. The screw holes 71 and the case side pedestals 73 function as two fixing units to which the lens holder 52 is fixed with the screws 72.

The protruding piece receiving unit 75 includes a flat surface that is in surface contact with a bottom surface 83a (surface facing the −Z direction) of the protruding piece 83 of the lens holder 52. The protruding piece receiving unit 75 is preferably provided at a location near a location 6a (FIG. 6) where the lower case 22 and the upper case 21 are fixed by a screw or the like after the lower case 22 and the upper case 21 are fitted to each other.

The lens holder 52 includes the two holder side screw holes 81 and the protruding piece 83.

The holder side screw holes 81 receive the screws 72 in the up-down direction (Z direction). The screw holes 81 are provided in holder side pedestals 82 including a seat surface that substantially coincides with the horizontal plane (XY plane). The screw holes 81 are provided at two locations so that the screw holes 81 are substantially symmetrical in a left-right direction (Y direction) with respect to an optical axis direction (X direction) of the light source 56.

The protruding piece 83 has a flat thin plate shape protruding to the outside of the lens holder 52 (backlight unit 41). As illustrated in FIG. 6, the protruding piece 83 is installed so that the bottom surface 83a faces the protruding piece receiving unit 75 of the lower case 22, and then sandwiched between the lower case 22 (first case) and the upper case 21 (second case). As a result, the lens holder 52 is fixed to the case 6. The protruding piece 83 protrudes, to the outside (−X direction) of the case 6, substantially perpendicularly to the up-down direction (Z direction) being a direction in which the lower case 22 and the upper case 21 are fitted together. It is noted that the protruding piece 83 may be sandwiched and further screwed to the lower case 22, or instead of being sandwiched, the protruding piece 83 may be screwed to the lower case 22.

The lens holder 52 is fixed to the case 6 at three locations by screwing the screws 72 into the screw holes 81 at two locations and sandwiching the protruding piece 83 between the lower case 22 and the upper case 21.

As mentioned above, in the HUD 1 described above, the heat sink 53 is made of the heat conductive resin, and thus, it is possible to improve the manufacturability and reduce the weight of the HUD 1. On the other hand, the heat conductive resin is vulnerable to impact and may be damaged if subjected to an impact during transport or assembling.

Therefore, in the HUD 1, the protective wall 60 provided on the lower case 22 protects the heat sink 53 that protrudes from the case 6 and is exposed from the case 6. Thus, in the HUD 1, it is possible to prevent a direct impact and damage to the heat sink 53. Therefore, the HUD 1 has excellent handling properties during transport and assembling.

However, by providing the protective wall 60 and surrounding the heat sink 53 by the protective wall 60, heat dissipation may be reduced. Therefore, the heat exhaust port 61 is provided in the protective wall 60. Thus, in the HUD 1, it is possible to protect the heat sink 53 and at the same time maintain the heat dissipation.

Although some embodiments of the present invention have been described, these embodiments are presented by way of example and are not intended to limit the scope of the invention. These novel embodiments can be implemented in various other forms, and various omissions, replacements, and changes can be made without departing from the scope of the invention. These embodiments and modifications thereof are included in the scope and gist of the invention, and are included in the invention described in the claims and the equivalents thereof.

For example, the lens holder 52 may support a bottom surface of the heat sink 53 by an elastic member instead of fixation by sandwiching the protruding piece 83 between the lower case 22 and the upper case 21.

Figure 7:
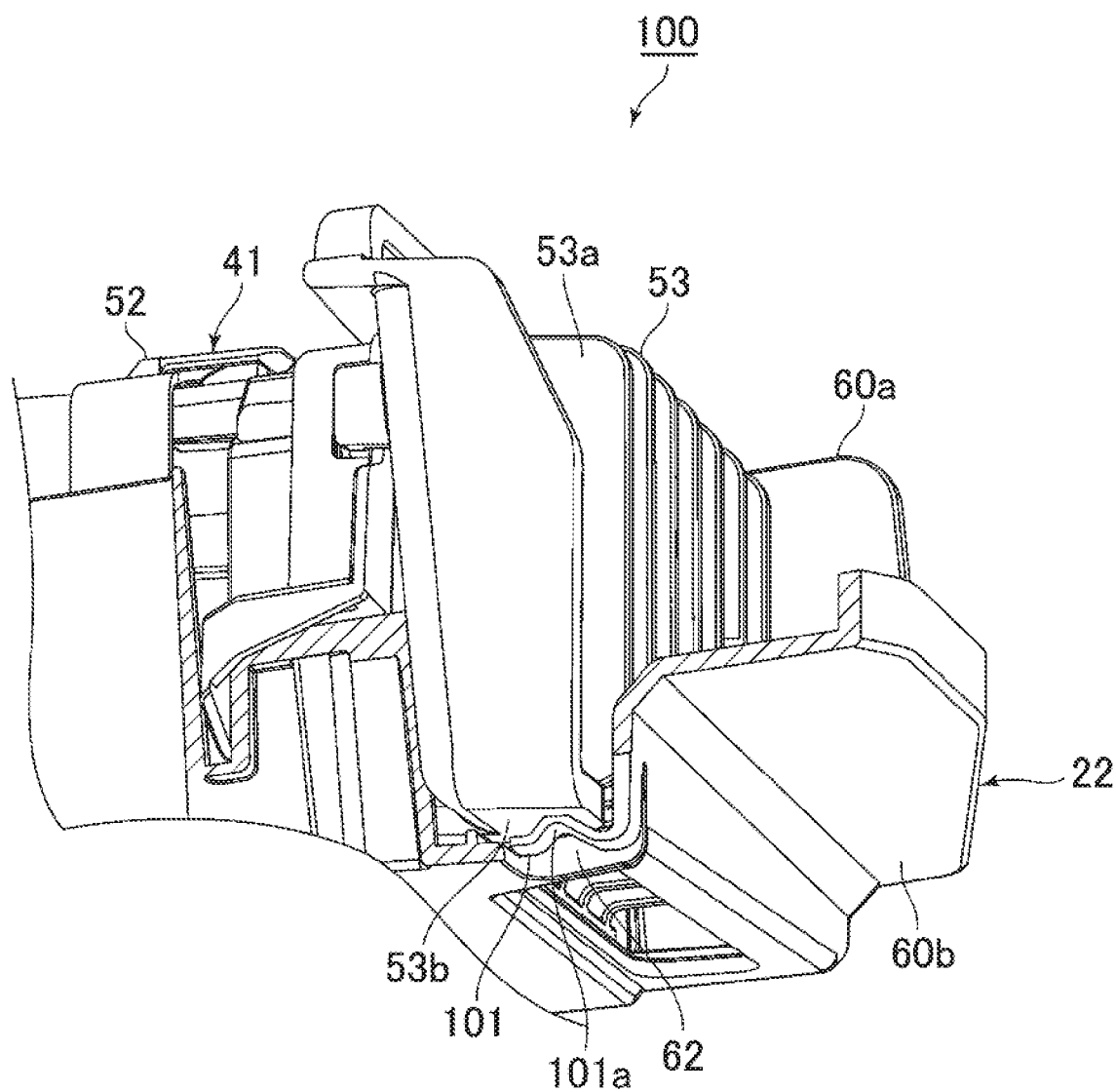
FIG. 7 is a cross-sectional view of a head-up display as a modification, particularly illustrating a periphery of an elastic member.

FIG. 7 is a cross-sectional view of an HUD 100 as a modification, particularly illustrating a periphery of an elastic member 101. It is noted that, in FIG. 7, the same reference numerals are given to the configuration and portions corresponding to those of the HUD 1, and a duplicated description will be omitted.

The elastic member 101 is a leaf spring provided at a position of the drain hole 62 of the bottom surface side protective wall 60b of the lower case 22. The elastic member 101 includes an upwardly convex pressing unit 101a that contacts a bottom surface 53b. The pressing unit 101a contacts the bottom surface 53b of the heat sink 53, and thus, the elastic member 101 can absorb a vibration even if the backlight unit 41 vibrates about a fulcrum formed by two locations where the backlight unit 41 is fixed by screws to the lower case 22. Thus, a holding property of the backlight unit 41 with respect to the case 6 can be improved.

Further, even if the protruding piece 83 and the protruding piece receiving unit 75 cannot be provided for design reasons, an area where the protective wall 60 (bottom surface side protective wall 60b) needs to be provided can also serve as an area where a structure for supporting the backlight unit 41 is provided. Therefore, the holding property of the backlight unit 41 can be maintained.

Furthermore, if the lower case 22 is formed by injection molding, a hole is formed in the forming process of the elastic member 101. This hole can function as the drain hole 62 described above.

In the HUD 1, the backlight unit 41 may be supported by the elastic member 101, in addition to being fixed by the sandwiching of the protruding piece 83. As long as the elastic member 101 can suppress the vibration of the backlight unit 41, the elastic member 101 may be provided in the upper case 21, instead of the lower case 22.

Further, the protruding piece 83 may have a shape other than the flat thin plate shape (for example, a cylindrical shape) as long as the protruding piece 83 has a shape that protrudes outside the lens holder 52 (backlight unit 41) and allows for sandwiching of the protruding piece 83.

Although an example in which the heat sink 53 is formed of a heat conductive resin has been described, the HUD of the present invention is not limited thereto, and can be applied to all HUDs in which an impact on the heat sink needs to be reduced.

DESCRIPTION OF REFERENCE NUMERALS

1 Head-up display
3 Display device
4 Plane mirror
5 Concave mirror
6 Case
7 Control board
21 Upper case
22 Lower case
22a Case side surface
23 Internal space
27, 28 Opening
29 Outer surface
30 Light transmissive cover 31 Board cover
40 Liquid crystal display panel
41 Backlight unit
50 Light source substrate
51 Lens
51a Lens unit
52 Lens holder
53 Heat sink
53a Fin
53b Bottom surface
54 Heat conductive sheet
56 Light source
57 Screw
58 Lens cover
59 Lens
60 Protective wall
60a Side surface side protective wall
60b Bottom surface side protective wall
61 Heat exhaust port
62 Drain hole
71 Case side screw hole
72 Screw
73 Case side pedestal
75 Protruding piece receiving unit
81 Holder side screw hole
82 Holder side pedestal
83 Protruding piece
83a Bottom surface
101 Elastic member
101a Pressing unit

The invention claimed is:

1. A head-up display comprising:
a display panel;
a substrate including a light source that illuminates the display panel from a back side;
a heat sink that dissipates heat transmitted from the substrate; and
a case that accommodates the heat sink,
wherein the case includes:
an opening that exposes at least a part of the heat sink; and
a protective wall that has an amount of protrusion larger than an amount of protrusion of the heat sink protruding from the opening and protects the heat sink protruding from the opening, and
wherein the protective wall includes a heat exhaust port that causes convection of heat dissipated by the heat sink.

2. The head-up display according to claim 1, wherein the heat sink is made of a heat conductive resin.

3. A head-up display comprising:
a display panel;
a substrate including a light source that illuminates the display panel from a back side;
a heat sink that dissipates heat transmitted from the substrate; and
a case that accommodates the heat sink,
wherein the case includes:
an opening that exposes at least a part of the heat sink; and
a protective wall that has an amount of protrusion larger than an amount of protrusion of the heat sink protruding from the opening and protects the heat sink protruding from the opening, and
wherein the protective wall includes a drain hole for draining water at a lowermost position of the protective wall in a vertical direction.

4. The head-up display according to claim 3, wherein the heat sink is made of a heat conductive resin.

* * * * *

UNITED STATES PATENT AND TRADEMARK OFFICE
CERTIFICATE OF CORRECTION

| | |
|---|---|
| PATENT NO. | : 11,226,488 B2 |
| APPLICATION NO. | : 16/969845 |
| DATED | : January 18, 2022 |
| INVENTOR(S) | : Wataru Saito et al. |

It is certified that error appears in the above-identified patent and that said Letters Patent is hereby corrected as shown below:

On the Title Page

Item [30], under Foreign Application Priority Data, should list as follows:
-- March 21, 2018 (JP)............................ 2018-053600 --

Signed and Sealed this
Twenty-second Day of November, 2022

Katherine Kelly Vidal
*Director of the United States Patent and Trademark Office*